United States Patent
Thangaraj et al.

(10) Patent No.: US 11,224,918 B2
(45) Date of Patent: Jan. 18, 2022

(54) SRF E-BEAM ACCELERATOR FOR METAL ADDITIVE MANUFACTURING

(71) Applicant: Fermi Research Alliance, LLC, Batavia, IL (US)

(72) Inventors: Jayakar C Thangaraj, Aurora, IL (US); Robert Kephart, Pioneer, CA (US); Thomas K Kroc, Batavia, IL (US)

(73) Assignee: FERMI RESEARCH ALLIANCE, LLC, Batavia, IL (US)

( * ) Notice: Subject to any disclaimer, the term of this patent is extended or adjusted under 35 U.S.C. 154(b) by 352 days.

(21) Appl. No.: 16/250,899

(22) Filed: Jan. 17, 2019

(65) Prior Publication Data
US 2019/0224751 A1    Jul. 25, 2019

Related U.S. Application Data

(60) Provisional application No. 62/619,482, filed on Jan. 19, 2018.

(51) Int. Cl.
| | |
|---|---|
| H05H 7/22 | (2006.01) |
| B22F 12/00 | (2021.01) |
| H05H 7/20 | (2006.01) |
| H01J 37/073 | (2006.01) |
| B22F 10/36 | (2021.01) |
| B22F 10/28 | (2021.01) |
| B22F 10/64 | (2021.01) |
| B22F 12/41 | (2021.01) |
| B22F 10/10 | (2021.01) |

(52) U.S. Cl.
CPC .............. *B22F 12/00* (2021.01); *B22F 10/28* (2021.01); *B22F 10/36* (2021.01); *B22F 10/64* (2021.01); *B22F 12/41* (2021.01); *H01J 37/073* (2013.01); *H05H 7/20* (2013.01); *H05H 7/22* (2013.01); *B22F 10/10* (2021.01); *H05H 2007/227* (2013.01)

(58) Field of Classification Search
CPC .......... B22F 12/00; B22F 12/41; B22F 12/43; B22F 12/44; B22F 10/36; B22F 10/28; H01J 37/073; H05H 7/20; H05H 7/22
USPC ........................................................ 313/22
See application file for complete search history.

(56) References Cited

U.S. PATENT DOCUMENTS

| | | |
|---|---|---|
| 6,172,463 B1 | 1/2001 | Roy |
| 6,713,540 B2 | 3/2004 | Rached et al. |
| 6,753,478 B2 | 6/2004 | Rodway et al. |
| 8,198,350 B2 | 6/2012 | Fee et al. |
| 8,277,738 B2 | 10/2012 | Kim et al. |

(Continued)

FOREIGN PATENT DOCUMENTS

| | | |
|---|---|---|
| EP | 0 731 232 A2 | 9/1996 |
| EP | 1 645 587 A1 | 4/2006 |

(Continued)

*Primary Examiner* — Christopher M Raabe
(74) *Attorney, Agent, or Firm* — Loza & Loza LLP; Kevin L. Soules

(57) ABSTRACT

A system and apparatus for electron beam melting comprises a superconducting radio frequency accelerator configured to produce an electron beam, a conduction cooling system configured to cool the superconducting radio frequency accelerator, and an electron beam melting system wherein the electron beam melts power in a build chamber of the electron beam melting apparatus.

20 Claims, 9 Drawing Sheets

(56) References Cited

U.S. PATENT DOCUMENTS

| | | | |
|---|---|---|---|
| 8,389,642 B2 | 3/2013 | Goto et al. | |
| 8,674,630 B1 | 3/2014 | Cornelius | |
| 8,779,697 B2 | 7/2014 | Baurichter et al. | |
| 9,186,645 B2 | 11/2015 | Kephart | |
| 9,340,931 B2 | 5/2016 | Kephart | |
| 9,398,681 B2 | 7/2016 | Tantawi et al. | |
| 10,051,720 B1* | 8/2018 | Shorter | H01J 1/34 |
| 10,070,509 B2 | 11/2018 | Kephart | |
| 2004/0085096 A1 | 5/2004 | Ward et al. | |
| 2008/0068112 A1 | 3/2008 | Yu et al. | |
| 2011/0081553 A1 | 4/2011 | Mehlmann et al. | |
| 2012/0295048 A1 | 11/2012 | Al-Malaika et al. | |
| 2012/0326636 A1 | 12/2012 | Eaton et al. | |
| 2013/0316087 A1 | 11/2013 | Ahn et al. | |
| 2014/0270955 A1 | 9/2014 | Coe | |
| 2015/0165525 A1 | 6/2015 | Jonasson | |
| 2016/0035531 A1 | 2/2016 | Lunin et al. | |
| 2017/0023499 A1* | 1/2017 | Mitchell | G01N 23/046 |
| 2017/0094770 A1* | 3/2017 | Kephart | H05H 7/22 |

FOREIGN PATENT DOCUMENTS

| | | |
|---|---|---|
| EP | 1 396 580 B1 | 6/2006 |
| EP | 1 690 702 B1 | 5/2012 |
| WO | 2002100133 | 12/2002 |
| WO | 2013090342 A1 | 6/2013 |
| WO | 2016043783 A1 | 3/2016 |

\* cited by examiner

SRF E-BEAM ACCELERATOR FOR METAL ADDITIVE MANUFACTURING

CROSS REFERENCE TO RELATED PATENT APPLICATIONS

This patent application claims the priority and benefit under 35 U.S.C. § 119(e) of U.S. Provisional Patent Application Ser. No. 62/619,482 filed Jan. 19, 2018, entitled "SRF E-BEAM ACCELERATOR FOR METAL ADDITIVE MANUFACTURING." U.S. Provisional Patent Application Ser. No. 62/619,482 is herein incorporated by reference in its entirety.

STATEMENT OF GOVERNMENT RIGHTS

The invention described in this patent application was made with Government support under the Fermi Research Alliance, LLC, Contract Number DE-AC02-07CH11359 awarded by the U.S. Department of Energy. The Government has certain rights in the invention.

TECHNICAL FIELD

Embodiments are generally related to the field of accelerators. Embodiments are further related to manufacturing devices. Embodiments are related to electron beam melting (EBM) manufacturing. Embodiments are additionally related to SRF e-beam accelerators used in manufacturing applications.

BACKGROUND

Additive metal manufacturing (AM) generally refers to on-demand production using a layer by layer process for fabrication. Applications for on-demand manufacturing have increased dramatically, driving a push for better quality, more efficient, and lower cost manufacturing solutions.

Current additive manufacturing systems are limited by beam energy. Furthermore, current additive manufacturing techniques are impractical and expensive, particularly for larger scale projects, or specialized builds that require greater beam energy. In addition, typical additive manufacturing systems are limited by the relatively short useful life of the electron beam source. The short functional lifetime of current additive manufacturing devices limits the economy and practically of such devices.

Technology that uses high voltage DC sources for generating an electron beam is used in a variety of applications. RF accelerators, originally developed for scientific applications, are currently being adapted for use in limited industrial and commercial applications. However, RF accelerators are historically large and expensive, both to create and to operate, and are typically made of copper. High power RF-based electron sources (also known as "RF e-guns") are thus not practical for use in additive manufacturing applications.

Accordingly, there is a need for methods and systems that provide increases in beam power for EBM machines using superconducting radio frequency accelerators, as described in the embodiments disclosed herein.

SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide a method and system for manufacturing.

It is another aspect of the disclosed embodiments to provide a method and system for EBM manufacturing.

It is another aspect of the disclosed embodiments to provide methods, systems, and apparatuses for compact SRF based accelerators.

It is another aspect of the disclosed embodiments to provide methods, systems, and apparatuses for improved manufacturing machines that incorporate electron beams generated from a high-power electron gun.

It is yet another aspect of the disclosed embodiments to provide methods, systems, and apparatuses employing high power electron guns comprising compact SRF based accelerators, for electron beam melting applications.

The aforementioned aspects and other objectives and advantages can now be achieved as described herein. Systems and methods disclosed herein comprise at least one accelerator cavity, an electron gun, at least one cavity cooler configured to at least partially encircle the accelerator cavity, a cooling connector, an intermediate conduction layer formed between the at least one cavity cooler and the at least one accelerator cavity configured to facilitate thermal conductivity between the cavity cooler and the accelerator cavity, a refrigeration source for providing cooling via the cooling connector to the at least one cavity cooler, and a manufacturing system wherein the electron gun serves as a source for an electron beam associated with the manufacturing system.

In an embodiment, a system comprises a particle accelerator configured to produce a particle beam, a conduction cooling system configured to conduct thermal energy away from the particle accelerator, and a manufacturing system wherein the particle beam provides energy to a build chamber of the additive manufacturing system.

In an embodiment of the system, the particle accelerator comprises a superconducting radio frequency accelerator. The superconducting radio frequency accelerator can further comprise a superconducting cavity, an electron gun, and a power coupler. In an embodiment the superconducting cavity further comprises at least 0.5 cells. The electron gun can further comprise a thermionic cathode and racetrack grid, or Field Emission cathode. In an embodiment, the superconducting cavity can further comprise a niobium cavity.

In an embodiment of the system, the particle beam comprises an electron beam. The manufacturing system can comprise an electron beam melting apparatus further comprising a beam bending assembly configured to adjust a position of the electron beam in the build chamber, a build platform configured in the build chamber, and a powder tank configured to provide powder to the build chamber.

In an embodiment of the system, the conduction cooling system further comprises a refrigeration source, a cavity cooler in conductive contact with the particle accelerator, and a cooling connector forming a conductive connection between the cavity cooler and the refrigeration source. The refrigeration source can comprise a cryocooler.

In another embodiment, a manufacturing system comprises a superconducting radio frequency accelerator configured to produce an electron beam, a conduction cooling system configured to cool the superconducting radio frequency accelerator, and an electron beam melting system wherein the electron beam melts powder in a build chamber of the electron beam melting apparatus.

In an embodiment of the manufacturing system, the superconducting radio frequency accelerator further comprises a superconducting cavity, an electron gun, and a power coupler. The superconducting cavity can further comprise a niobium cavity with at least 0.5 cells.

In an embodiment of the manufacturing system, the electron beam melting apparatus further comprises a beam bending assembly configured to adjust a position of the electron beam in the build chamber, a build platform configured in the build chamber, and a powder tank configured to provide the powder to the build chamber.

In an embodiment of the manufacturing system, the conduction cooling system further comprises a refrigeration source, a cavity cooler in conductive contact with the superconducting cavity, and a cooling connector forming a conductive connection between the cavity cooler and the refrigeration source. The refrigeration source can comprise a cryocooler.

In yet another embodiment, a manufacturing apparatus comprises a superconducting radio frequency accelerator configured to produce an electron beam, a refrigeration source, a cavity cooler for conducting thermal energy away from the superconducting radio frequency accelerator, a cooling connector forming a conductive connection between the cavity cooler and the refrigeration source, and an electron beam melting assembly comprising: a beam bending assembly configured to adjust a position of the electron beam in the build chamber, a build platform configured in the build chamber, and a powder tank configured to provide powder to a build chamber, wherein the electron beam melts the powder in the build chamber.

In an embodiment of the manufacturing apparatus, the superconducting radio frequency accelerator further comprises a superconducting cavity, an electron gun, and a power coupler. The superconducting cavity can further comprise a niobium cavity with at least 1.5 cells.

BRIEF DESCRIPTION OF THE FIGURES

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware, or any combination thereof (other than software per se). The following detailed description is therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment, and the phrase "in another embodiment" as used herein does not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Figure 1:
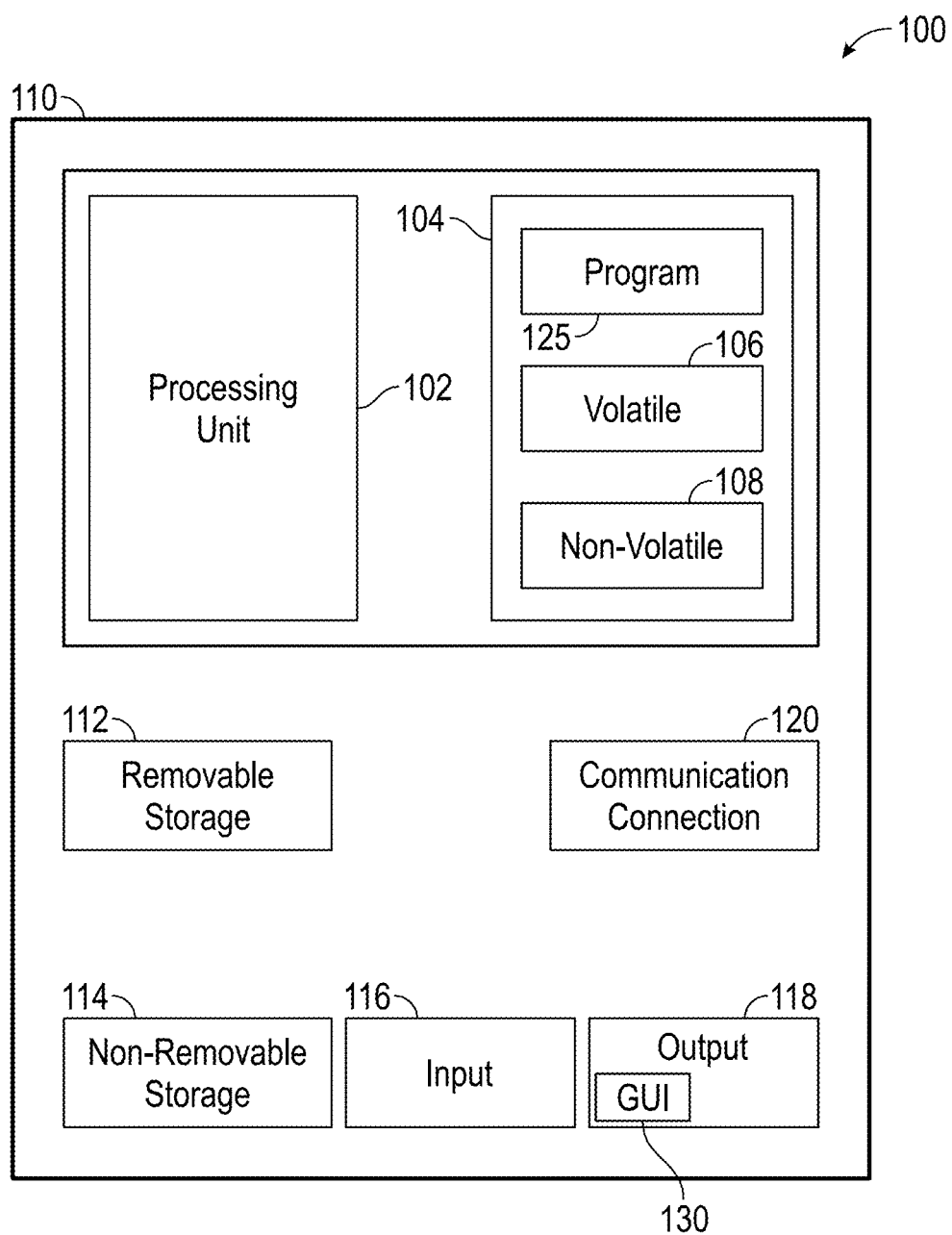
FIG. 1 depicts a block diagram of a computer system which is implemented in accordance with the disclosed embodiments.
Figure 2:
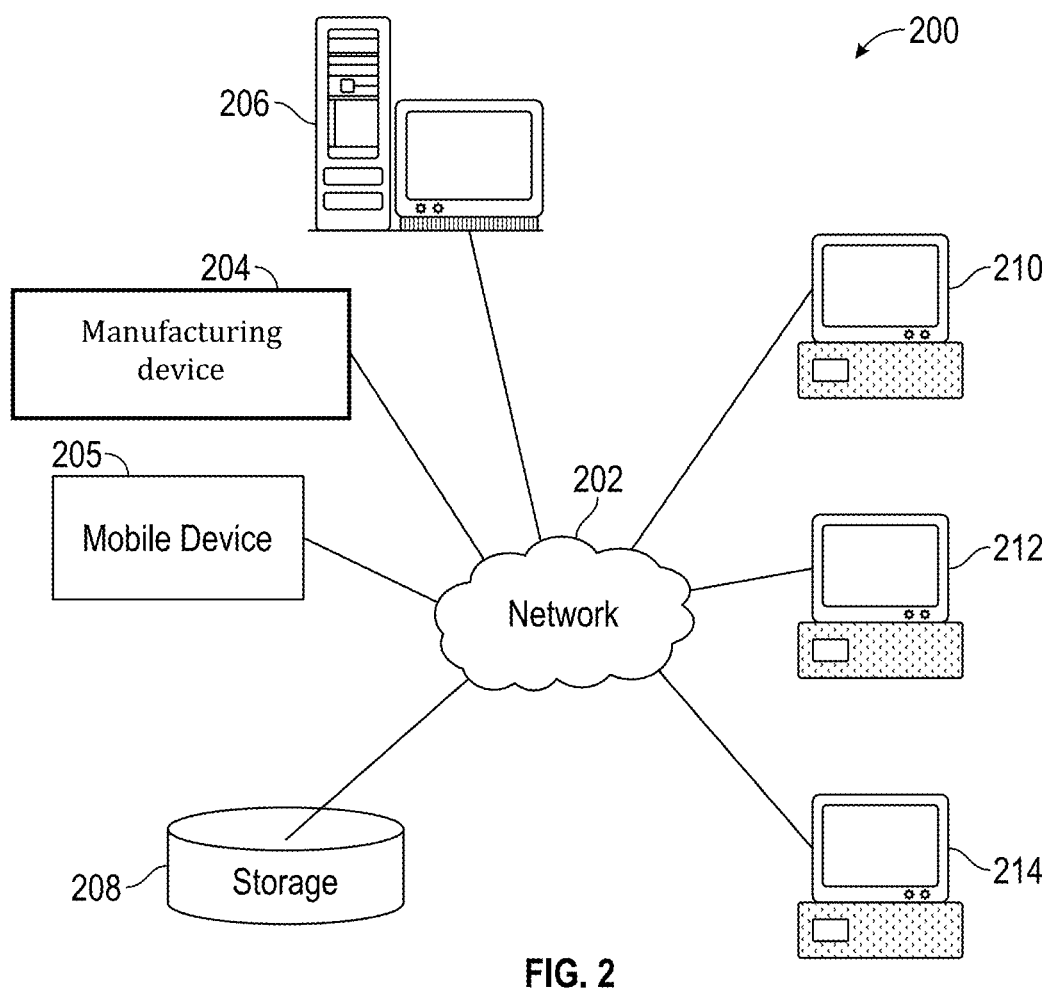
FIG. 2 depicts a graphical representation of a network of data-processing devices in which aspects of the present embodiments may be implemented.
Figure 3:
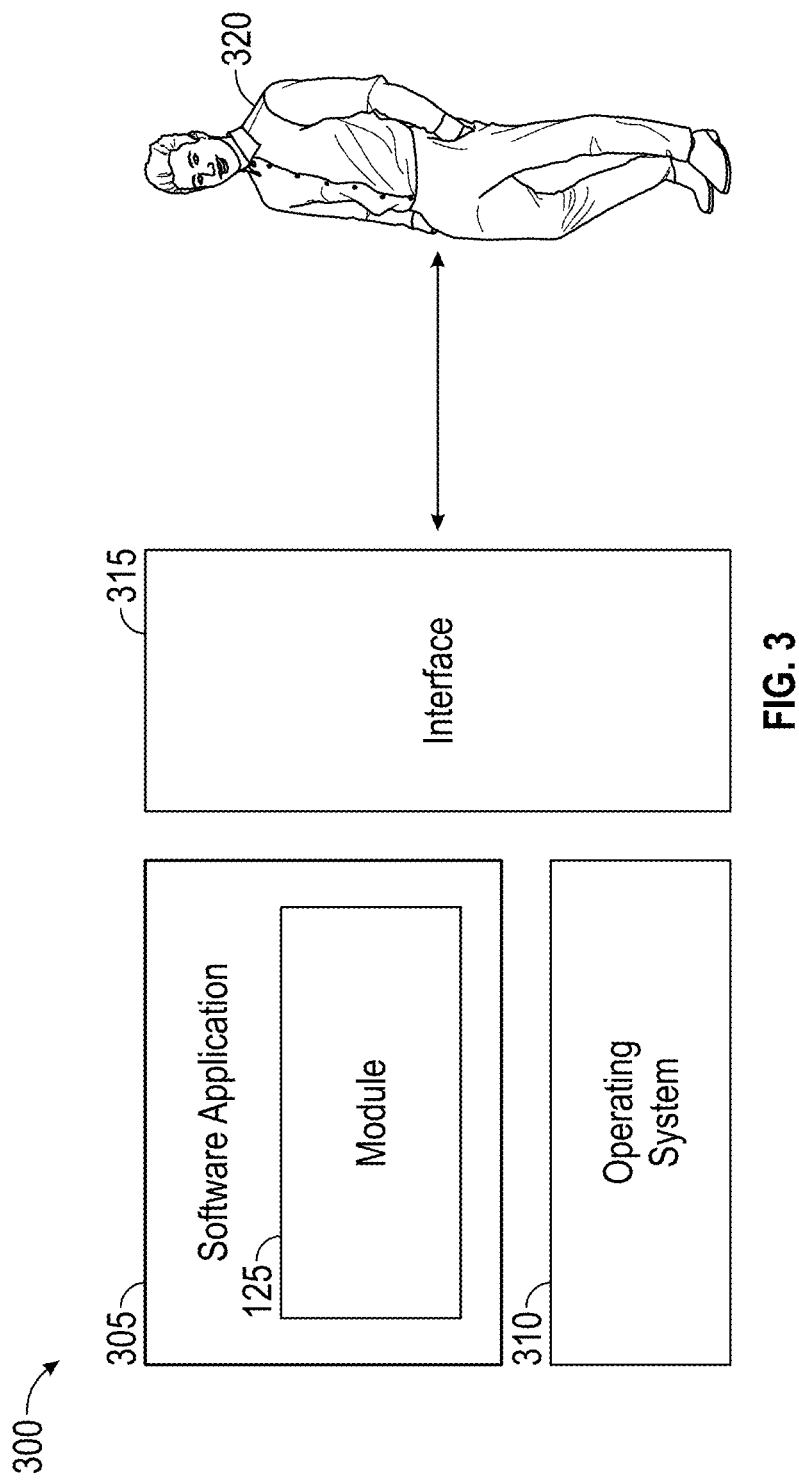
FIG. 3 depicts a computer software system for directing the operation of the data-processing system depicted in FIG. 1, in accordance with an example embodiment.

FIGS. 1-3 are provided as exemplary diagrams of data-processing environments in which embodiments of the present invention may be implemented. It should be appreciated that FIGS. 1-3 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments.

A block diagram of a computer system 100 that executes programming for implementing the methods and systems disclosed herein is shown in FIG. 1. A general computing device in the form of a computer 110 may include a processing unit 102, memory 104, removable storage 112, and non-removable storage 114. Memory 104 may include volatile memory 106 and non-volatile memory 108. Computer 110 may include or have access to a computing environment that includes a variety of transitory and non-transitory computer-readable media such as volatile memory 106 and non-volatile memory 108, removable storage 112 and non-removable storage 114. Computer storage includes, for example, random access memory (RAM), read only memory (ROM), erasable programmable read-only memory (EPROM) and electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage, or other magnetic storage devices, or any other medium capable of storing computer-readable instructions as well as data, including data comprising frames of video.

Computer 110 may include or have access to a computing environment that includes input 116, output 118, and a communication connection 120. The computer may operate in a networked environment using a communication connection to connect to one or more remote computers or devices. The remote computer may include a personal computer (PC), server, router, network PC, a peer device or other common network node, or the like. The remote device may include a sensor, photographic camera, video camera, tracking device, or the like. The communication connection may include a Local Area Network (LAN), a Wide Area Network (WAN) or other networks. This functionality is described in more fully in the description associated with FIG. 2 below.

Output 118 is most commonly provided as a computer monitor, but may include any computer output device. Output 118 may also include a data collection apparatus associated with computer system 100. In addition, input 116, which commonly includes a computer keyboard and/or pointing device such as a computer mouse, computer track pad, or the like, allows a user to select and instruct computer system 100. A user interface can be provided using output 118 and input 116. Output 118 may function as a display for displaying data and information for a user and for interactively displaying a graphical user interface (GUI) 130.

Note that the term "GUI" generally refers to a type of environment that represents programs, files, options, and so forth by means of graphically displayed icons, menus, and dialog boxes on a computer monitor screen. A user can interact with the GUI to select and activate such options by directly touching the screen and/or pointing and clicking with a user input device 116 such as, for example, a pointing device such as a mouse, and/or with a keyboard. A particular item can function in the same manner to the user in all applications because the GUI provides standard software routines (e.g., module 125) to handle these elements and report the user's actions. The GUI can further be used to display the electronic service image frames as discussed below.

Computer-readable instructions, for example, program module 125, which can be representative of other modules described herein, are stored on a computer-readable medium and are executable by the processing unit 102 of computer 110. Program module 125 may include a computer application. A hard drive, CD-ROM, RAM, Flash Memory, and a USB drive are just some examples of articles including a computer-readable medium.

FIG. 2 depicts a graphical representation of a network of data-processing systems 200 in which aspects of the present invention may be implemented. Network data-processing system 200 is a network of computers in which embodiments of the present invention may be implemented. Note that the system 200 can be implemented in the context of a software module such as program module 125. The system 200 includes a network 202 in communication with one or more clients 210, 212, and 214. Network 202 is a medium that can be used to provide communications links between various devices and computers connected together within a networked data processing system such as computer system 100. Network 202 may include connections such as wired communication links, wireless communication links, or fiber optic cables. Network 202 can further communicate with one or more servers 206, one or more external devices such as a printer, copier, scanner, fax machine, multi-function device, multi-function printer, sensor, detector, manufacturing device, additive manufacturing device, EBM device or the like 204, a mobile device 205 and a memory storage unit such as, for example, memory or database 208.

In the depicted example, manufacturing device 204 and server 206 connect to network 202 along with storage unit 208. In addition, clients 210, 212, and 214 connect to network 202. These clients 210, 212, and 214 may be, for example, personal computers or network computers. Computer system 100 depicted in FIG. 1 can be, for example, a client such as client 210, 212, and/or 214. Alternatively, clients 210, 212, and 214 may also be, for example, a photographic camera, video camera, tracking device, sensor, etc.

Computer system 100 can also be implemented as a server such as server 206, depending upon design considerations. In the depicted example, server 206 provides data such as boot files, operating system images, applications, and application updates to clients 210, 212, and 214, and/or to manufacturing device 204. Clients 210, 212, and 214 and manufacturing device 204 are clients to server 206 in this example. Network data-processing system 200 may include additional servers, clients, and other devices not shown. Specifically, clients may connect to any member of a network of servers, which provide equivalent content.

In the depicted example, network data-processing system 200 is the Internet with network 202 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers consisting of thousands of commercial, government, educational, and other computer systems that route data and messages. Of course, network data-processing system 200 may also be implemented as a number of different types of networks such as, for example, an intranet, a local area network (LAN), or a wide area network (WAN). FIGS. 1 and 2 are intended as examples and not as architectural limitations for different embodiments of the present invention.

FIG. 3 illustrates a computer software system 300, which may be employed for directing the operation of the data-processing systems such as computer system 100 depicted in FIG. 1. Software application 305, may be stored in memory 104, on removable storage 112, or on non-removable storage 114 shown in FIG. 1, and generally includes and/or is associated with a kernel or operating system 310 and a shell or interface 315. One or more application programs, such as module(s) 125, may be "loaded" (i.e., transferred from removable storage 112 into the memory 104) for execution by the data-processing system 100. The data-processing system 100 can receive user commands and data through user interface 315, which can include input 116 and output 118, accessible by a user 320. These inputs may then be acted upon by the computer system 100 in accordance with instructions from operating system 310 and/or software application 305 and any software module(s) 125 thereof.

Generally, program modules (e.g., module 125) can include, but are not limited to, routines, subroutines, software applications, programs, objects, components, data structures, etc., that perform particular tasks or implement particular abstract data types and instructions. Moreover, those skilled in the art will appreciate that the disclosed method and system may be practiced with other computer system configurations such as, for example, hand-held devices, multi-processor systems, data networks, microprocessor-based or programmable consumer electronics, networked personal computers, minicomputers, mainframe computers, servers, and the like.

Note that the term "module" as utilized herein may refer to a collection of routines and data structures that perform a particular task or implements a particular abstract data type. Modules may be composed of two parts: an interface, which lists the constants, data types, variable, and routines that can be accessed by other modules or routines, and an implementation, which is typically private (accessible only to that module) and which includes source code that actually implements the routines in the module. The term module may also simply refer to an application such as a computer program designed to assist in the performance of a specific task such as word processing, accounting, inventory management, etc.

The interface 315 (e.g., a graphical user interface 130) can serve to display results, whereupon a user 320 may supply additional inputs or terminate a particular session. In some embodiments, operating system 310 and GUI 130 can be implemented in the context of a "windows" system. It can be appreciated, of course, that other types of systems are possible. For example, rather than a traditional "windows" system, other operation systems such as, for example, a real-time operating system (RTOS) more commonly employed in wireless systems may also be employed with respect to operating system 310 and interface 315. The software application 305 can include, for example, module(s) 125, which can include instructions for carrying out steps or logical operations such as those shown and described herein.

The following description is presented with respect to embodiments of the present invention, which can be embodied in the context of a data-processing system such as computer system 100, in conjunction with program module 125, and data-processing system 200 and network 202 depicted in FIGS. 1-2. The present invention, however, is not limited to any particular application or any particular environment. Instead, those skilled in the art will find that the system and method of the present invention may be advantageously applied to a variety of system and application software including database management systems, word processors, and the like. Moreover, the present invention may be embodied on a variety of different platforms including Macintosh, UNIX, LINUX, LabView and the like. Therefore, the descriptions of the exemplary embodiments, which follow, are for purposes of illustration and not considered a limitation.

Compact SRF-based accelerators, as disclosed herein, can be used to create compact, robust, high-power, high-energy, electron-beam, or x-ray sources. The operating temperature of SRF-based accelerators can be controlled using conduction cooling systems. Such systems can be integrated into a single design. Taken together, these technologies enable a new class of compact, simple, SRF-based accelerators for industrial, additive manufacturing applications. U.S. Pat. No. 10,070,509, titled "Compact SRF Based Accelerator" describes such accelerator and conduction cooling technology. U.S. Pat. No. 10,070,509 is herein incorporated by reference in its entirety.

Figure 4:
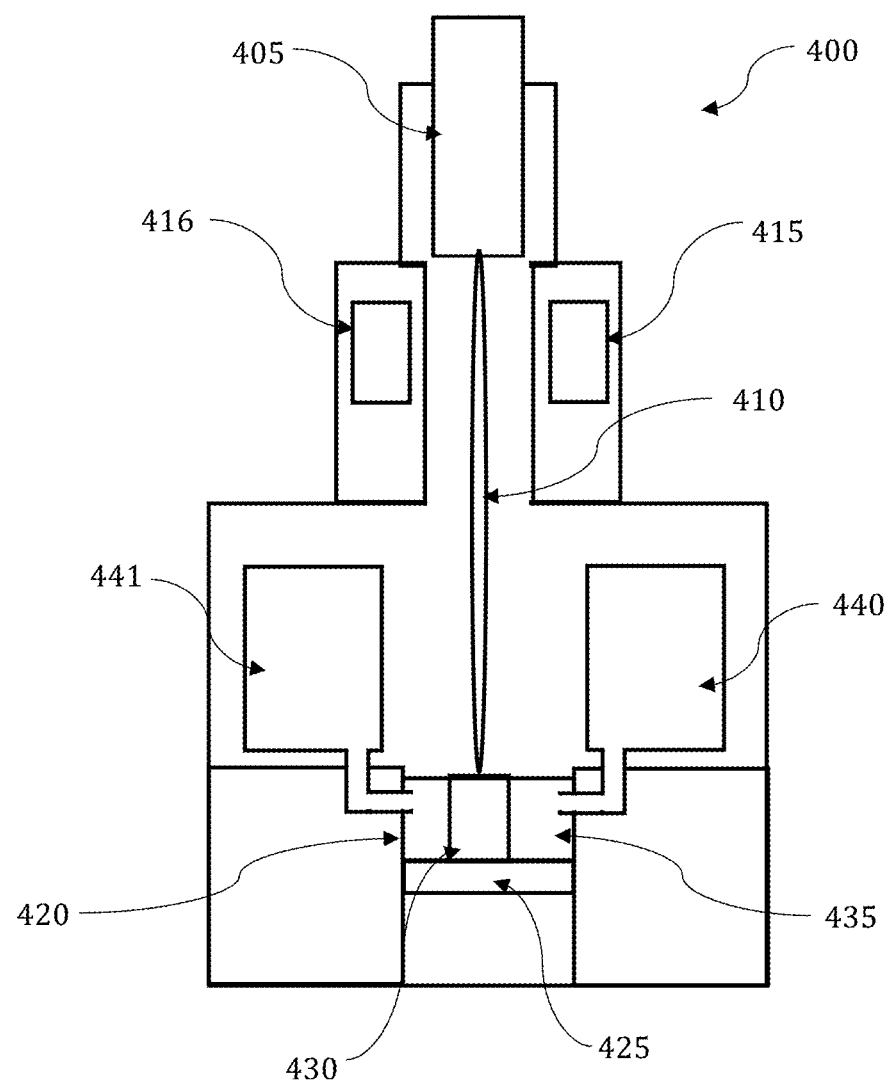
FIG. 4 depicts a block diagram of a manufacturing system, in accordance with the disclosed embodiments.

The methods and systems disclosed herein provide a superconducting radio frequency (SRF) accelerator, fitted with a conduction cooling assembly which serves as the electron beam source for an advanced 3D manufacturing system 400, as illustrated in FIG. 4. In an embodiment, the superconducting (SRF) accelerator can be used to serve as the electron beam source for a specially designed electron beam melting (EBM), or other additive manufacturing, device.

Electron beam melting is an additive manufacturing process where metal powder or wire is melted in a specified pattern to render a desired object. EBM can use a base material (usually metal powder, although other materials are possible) that is held in powder form in a powder bed. The powder is often preheated in thin layers. An electron beam is then used to melt the powder, layer-by-layer, to create a three-dimensional object. In other embodiments, EBM can comprise a wire fed assembly wherein metal wire feedstock is deposited and melted in order to form a three-dimensional object.

The system 400 comprises an exemplary EBM manufacturing system with a superconducting radio frequency cavity accelerator assembly 405, in accordance with the embodiments disclosed herein. An EBM system is illustrative of one embodiment of an additive manufacturing device. In other embodiments, other manufacturing systems can include additive manufacturing technologies, wire fed manufacturing devices, powder bed fusion devices, and other such additive manufacturing systems.

The system 400, includes an electron beam 410 that is produced by the superconducting cavity accelerator 405. The system 400 can selectively melt the powder 435, layer-by-layer, using the electron beam 410. The electron beam 410 is produced by the SRF cavity accelerator 405. In certain embodiments, a computer system, such as computer system 100, can be used to control the path traced by electron beam 410, in order to create the desired pattern or three-dimensional shape in the powder bed. The electron beam 410 can be adjusted and manipulated in various ways, with one or more beam alignment assemblies 415 and 416. It should be appreciated that such beam alignment assemblies 415 and 416 can comprise electromagnets, or other such beam bending components.

A build chamber 420 can be configured as a vacuum chamber, and can include an adjustable build platform 425 on which the powder bed, and ultimately work piece 430 can rest. Powder 435, (generally comprising metallic powder), is fed into the build chamber 420 from powder tank 440 and powder tank 441.

It should be understood that, in other embodiments, other EBM or additive manufacturing systems can be used. For example, in some embodiments, the system 400 can comprise a wire fed manufacturing device where wire feedstock is melted with an electron beam provided by the superconducting RF cavity, or other such additive manufacturing device.

Figure 5:
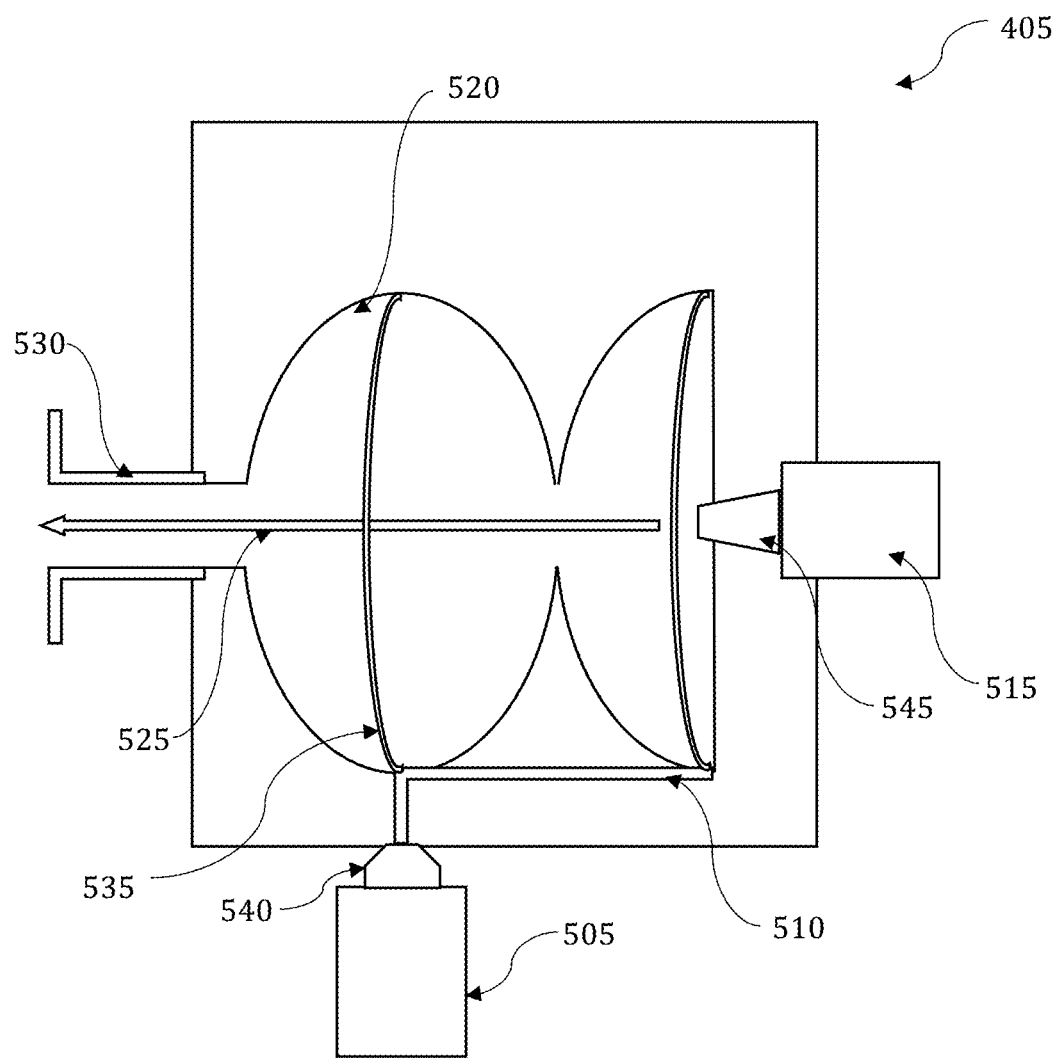
FIG. 5 depicts a block diagram of a particle accelerator, in accordance with the disclosed embodiments.

FIG. 5 illustrates a diagram of an exemplary SRF cavity accelerator 405, in accordance with the disclosed embodiments. The SRF cavity accelerator 405 can comprise a 1.5 cell pure Niobium cavity 520 as illustrated in FIG. 5. It should be understood that in other embodiments the SRF cavity 520 can comprise any number of cells (e.g. 0.5 cells, 2.5 cells, etc.) as required for the particular manufacturing application. It should also be understood that in other embodiments, the superconducting material can comprise $Nb_3Sn$, $Mg_3B_2$, or other such materials. In certain embodiments, the SRF accelerator 405 can further comprise a 650 MHz cavity, but other frequencies can be used in other embodiments.

The SRF cavity accelerator 405 can further include an electron source 515 that can be integrated into a cell of the cavity 520. In other embodiments, the electron source 515 can be a separate module. The electron source 515 provides the electrons that are ultimately accelerated into electron beam 525, that is provided to the manufacturing system through flange 530. In certain embodiments the electron source can further comprise a cathode 545 such as a thermionic cathode or a field emission cathode.

It should be appreciated that the embodiments disclosed herein can use a cathode as the particle source, with no associated anode. The cathode 545 produces charged particles, which can be accelerated with SRF cavity accelerator 405. The cathode 545 can use thermionic emission, field emission, or even photo emission. Field emission cathodes provide the benefit that they can be turned on and off quickly. Thermionic emission cathodes generally must heat up and are therefore typically left running during operation.

The cavity accelerator 405 can be cooled using conduction cooling. Conduction cooling is accomplished using a cavity cooler 535 connected to a refrigeration source 505 with a cooling connector 510.

In the exemplary embodiment illustrated in FIG. 5, the cavity cooler 535 at least partially encircles the cells of accelerator cavity 520, making thermal contact to remove heat from the accelerator cavity 520. Materials with high thermal conductivity, that can be used for cavity cooler 535 include, but are not limited to, high-purity aluminum, diamond, or carbon nanotubes. In certain embodiments, cavity cooler 520 can include multiple cavity coolers 520 that encircle each cell of the accelerator cavity 520. In certain embodiments, the cooling connector 510 connects each cavity cooler 535 to a refrigeration source 505.

In the exemplary embodiment, refrigeration source 505 is a commercially available cryocooler having a power requirement of approximately 1 W to approximately 100 W. In other embodiments, refrigeration source 505 is a vessel containing cryogenic fluid. A cold tip 540 of refrigeration source 505 clamps to cooling connector 510. The cold tip 540 facilitates efficient conduction of heat from cooling connector 510 to refrigeration source 505.

In certain embodiments, a cryostat used for cooling the cavity can contain no liquid cryogens. The cooling source (e.g. refrigeration source 505) for both the thermal shield and superconducting cavity can be a set of cryocoolers. One or more sufficient units to remove both the static heat load and the dynamic heat loads during operation can be used. The number of cryocoolers can be adjusted depending on the achievable accelerator heat loads and available cryocooler 4K capacities.

Figure 6:
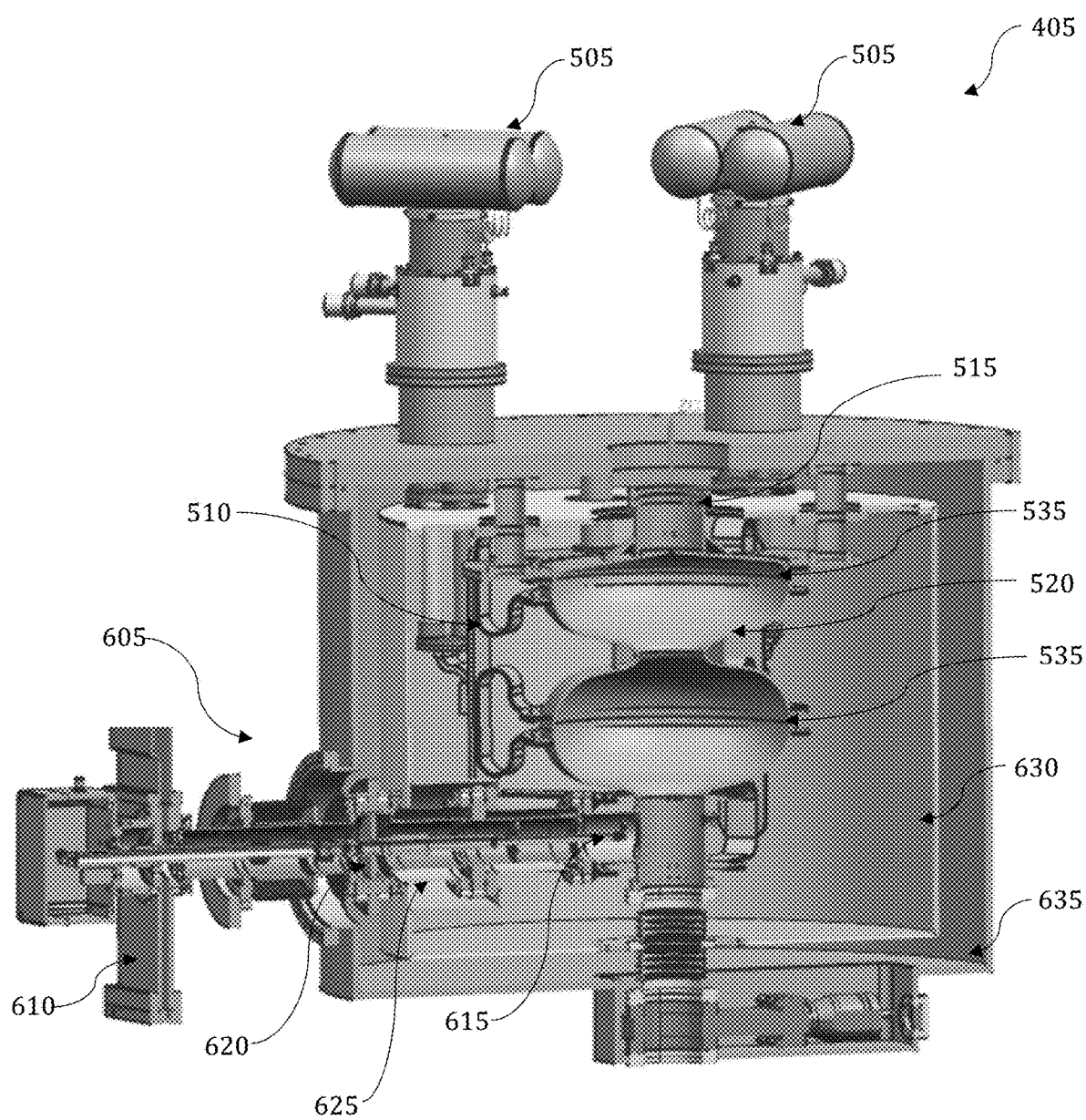
FIG. 6 depicts a cutout view of a particle accelerator, in accordance with the disclosed embodiments.

FIG. 6 illustrates a cutaway view of a cavity accelerator 405 in accordance with the disclosed embodiments. As illustrated, the refrigeration sources 505 are configured outside the outer housing 635 and connected to the cavity cells 520 via cavity coolers 535 and cooling connectors 510.

A low heat leak fundamental power coupler 605 can couple the cavity 520 to an input waveguide 610. The coupler 605 functions to deliver RF power along an antenna 615 from an outside RF power source, with minimal ohmic loss, to the superconducting cavity 520. The coupler 605 isolates the cavity vacuum inside the cavity housing 630 with a window 620 (often made of ceramics, or other such materials) that can minimize heat flow from the surroundings. In an embodiment, the outer conductor 625 is made of stainless steel coated with a thin layer of copper.

In an embodiment, the electron source 515 can be a thermionic cathode, or field emission cathode, that serves as the source of the electrons. It should be understood that in other aspects, electron source 515 can be any electron source, that supplies sufficient electron flux with the proper optical parameters to match with the accelerating cavity(ies). The electron source 515 can be integrated into a cell of the cavity 520 or the electron source 515 can be a separate module.

Figure 7A:
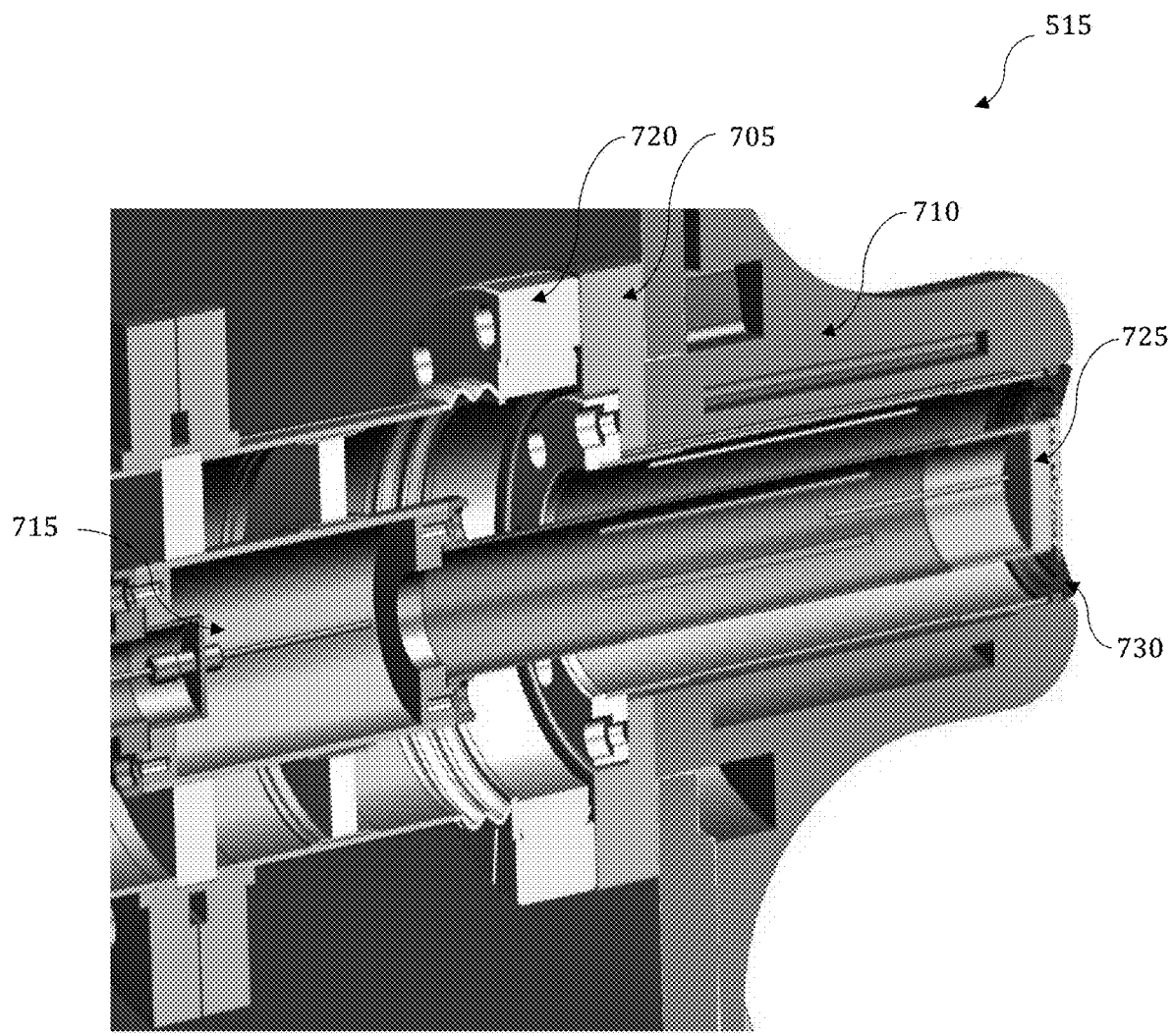
FIG. 7A depicts a cutout view of an electron gun, in accordance with the disclosed embodiments.
Figure 7B:
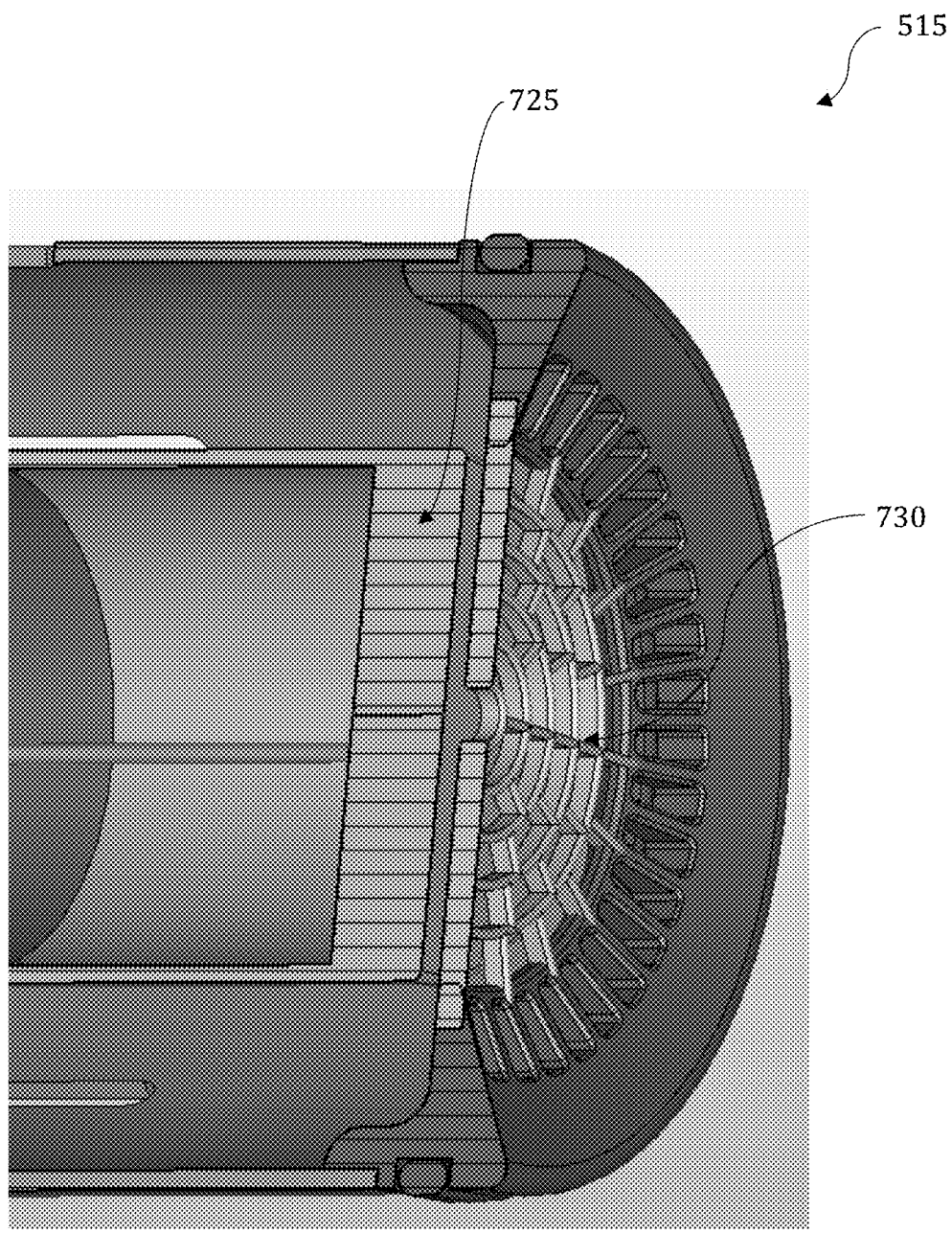
FIG. 7B depicts a cutout view of an electron gun, in accordance with the disclosed embodiments.
Figure 7C:
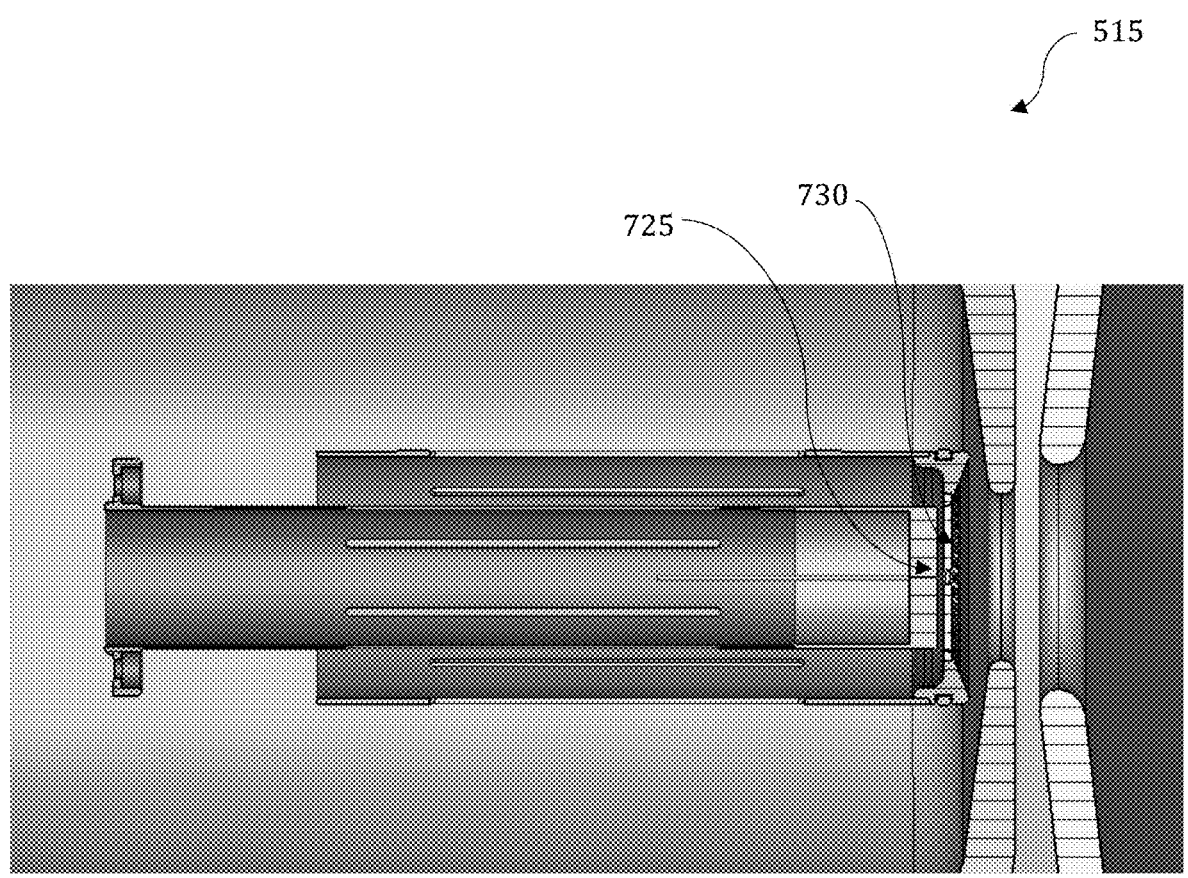
FIG. 7C depicts a cutout view of an electron gun, in accordance with the disclosed embodiments.

The RF gun design is further detailed in FIGS. 7A-7C. The cathode 725 is formed adjacent to a racetrack grid 730. The cold part of the RF gun can be directly exposed to the ultra-clean inside surface of the (preferably high Q) SRF cavity 520. In certain embodiments it can meet UHV standards and will be cleaned and assembled mechanically with the thermionic cathode 725, in a clean room before being attached to the cavity. The thermionic cathode 725 can be connected to a flange with an Al diamond gasket. It should be understood that other materials can be used according to design considerations.

Brazed UHV ceramic isolator 705 and vacuum feedthrough 710 separate the clean vacuum part of the gun 515 from the non-vacuum part. A feedthrough inside of the inner conductor can incorporate a cathode heating wire and a DC bias. The outer electrode of the RF coaxial line 715 can also operate under a DC bias. This electrode is attached to a 70K (or other dimensioned) thermal shield through the ceramic isolator 705 with good thermal conductivity. A convolution stainless steel bellows 720 can be used for thermal isolation between 4K and 70K parts.

With respect to the electron gun 515 and its injection system (e.g. an injection locked magnetron), such systems can be operated in various regimes without electron backward bombardment and can achieve small energy spread and minimize beam losses during acceleration.

Because the beam energy is relatively low, a simple Faraday cup can serve as a beam dump. The thermionic source (or other such source) can be controlled by LabView software, or other computer control software, with a computer system 100 and computer network 200 as illustrated in FIGS. 1-3. The gun 515 can be operated in the space charge regime to extract maximum current. Tungsten slits can be inserted as apertures to control the current. In certain embodiments, voltage will be fixed.

Measurements indicate that a 9-cell, 1.3 GHz cavity operating at 10 MeV/m dissipates about 130 W. Thus, in certain embodiments, a 650 MHz, 1.5 cell cavity operating at 1 MV/m will be sufficient for manufacturing applications. The power loss will be given by equation (1)

$$130 * \frac{650 \text{ MHz}}{1300 \text{ MHz}} * \frac{1.5}{9} * \left(\frac{1\frac{\text{MeV}}{m}}{10\frac{\text{MeV}}{m}}\right)^2 \approx 0.1 \text{ W} \qquad (1)$$

The power loss of equation (1) combined with heat load from the sources, coupler, and beam losses are approximately 1 W (at max). In certain embodiments, the accelerator cavity can thus be cooled, as disclosed herein, with 4K cryocoolers operating 2 W. Considering the low losses, flexibility to go to a higher gradient for flexibility of printable materials are achievable. Additionally, the cryocooler can operate at higher temperature where the cooling capability is multi-W.

The embodiments disclosed herein describe SRF accelerators with conduction cooling, configured to provide a high power, high energy electron source for advanced 3D metal additive manufacturing. In some embodiments, the superconducting radio frequency (SRF) e-beam accelerator can generate a 50 kW beam power at 1 MeV. The beam current can be at least 50 mA with continuous wave (CW) operation. At 1 MeV energy, an electron will penetrate approximately 1 mm in steel (and various other metals). This is desirable for many additive manufacturing applications.

The superconducting accelerator can comprise a pure Niobium cavity that uses conduction cooling. In other embodiments the cavity can comprise $Nb_3Sn$, $Mg_3B_2$, or other such materials. Because of the low current extracted, the lifetime of the cathode for additive manufacturing applications can be improved by a factor of 10, as compared to conventional sources. In addition, the lifetime of the disclosed embodiments can exceed 4000 hours.

Based on the foregoing, it can be appreciated that a number of embodiments, preferred and alternative, are disclosed herein. In an embodiment, a system comprises a particle accelerator configured to produce a particle beam, a conduction cooling system configured to conduct thermal energy away from the particle accelerator, and a manufacturing system wherein the particle beam provides energy to a build chamber of the additive manufacturing system. The particle accelerator can comprise a superconducting radio frequency accelerator.

In an embodiment of the system, the superconducting radio frequency accelerator further comprises: a superconducting cavity, an electron gun, and a power coupler. In an embodiment of the system, the superconducting cavity further comprises at least 0.5 cells. In an embodiment of the system, the electron gun further comprises one of a thermionic cathode and a field emission cathode. In an embodiment of the system, the superconducting cavity further comprises a niobium cavity.

In an embodiment of the system, the particle beam comprises an electron beam. In an embodiment of the system, the manufacturing system comprises an electron beam melting apparatus. In an embodiment of the system, the electron beam melting apparatus further comprises: a beam bending assembly configured to adjust a position of the electron beam in the build chamber, a build platform configured in the build chamber, and a powder tank configured to provide powder to the build chamber.

In an embodiment of the system, the conduction cooling system further comprises: a refrigeration source, a cavity cooler in conductive contact with the particle accelerator, and a cooling connector forming a conductive connection between the cavity cooler and the refrigeration source. In an embodiment of the system, the refrigeration source comprises a cryocooler.

In another embodiment a manufacturing system comprises a superconducting radio frequency accelerator configured to produce an electron beam, a conduction cooling system configured to cool the superconducting radio frequency accelerator, and an electron beam melting system wherein the electron beam melts a build material associated with the electron beam melting apparatus.

In an embodiment of the apparatus, the superconducting radio frequency accelerator further comprises: a superconducting cavity, an electron gun, and a power coupler. In an embodiment of the apparatus, the superconducting cavity further comprises a niobium cavity with at least 0.5 cells.

In an embodiment of the apparatus, the electron beam melting apparatus further comprises: a beam bending assembly configured to adjust a position of the electron beam in the build chamber, a build platform configured in a build chamber, and a powder tank configured to provide the build material to the build chamber. In an embodiment of the apparatus, the conduction cooling system further comprises: a refrigeration source, a cavity cooler in conductive contact with the superconducting cavity, and a cooling connector forming a conductive connection between the cavity cooler and the refrigeration source. In an embodiment of the apparatus, the refrigeration source comprises a cryocooler.

In yet another embodiment, a manufacturing apparatus comprises a superconducting radio frequency accelerator configured to produce an electron beam, a refrigeration source, a cavity cooler for conducting thermal energy away from the superconducting radio frequency accelerator, a cooling connector forming a conductive connection between the cavity cooler and the refrigeration source, and an electron beam melting assembly comprising: a beam bending assembly configured to adjust a position of the electron beam in the build chamber, a build platform configured in the build chamber wherein the electron beam melts a build material in the build chamber.

In an embodiment of the manufacturing apparatus, the superconducting radio frequency accelerator further comprises a superconducting cavity, an electron gun, and a power coupler. In an embodiment of the manufacturing apparatus, the superconducting cavity further comprises a niobium cavity with at least 0.5 cells.

It will be appreciated that variations of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art which are also intended to be encompassed by the following claims.

What is claimed is:

1. A system comprising:
a particle accelerator configured to produce a particle beam the particle accelerator further comprising:
a superconducting cavity;
an electron gun;
a power coupler the power coupler configured to isolate a cavity vacuum inside a superconductor cavity housing with a ceramic window configured to minimize heat flow; and
a beam dump comprising a Faraday cup;
a conduction cooling system configured to conduct thermal energy away from the particle accelerator the conduction cooling system comprising a plurality of cavity coolers that fully encircle each cell of the particle accelerator superconducting cavity cells; and
a manufacturing system wherein the particle beam provides energy to a build chamber of the additive manufacturing system via a flange connecting the manufacturing system to the particle accelerator.

2. The system of claim 1 wherein the particle accelerator comprises one of:
a 650 MHz superconducting radio frequency accelerator with 1.5 cells, operating at 1 MV/m; and
a 1.3 GHz superconducting radio frequency accelerator.

3. The system of claim 2 wherein the superconducting radio frequency accelerator is configured to generate at least a 50 kW beam power at 1 MeV, and a beam current of at least 50 mA in a continuous wave operation.

4. The system of claim 1 wherein the superconducting cavity further comprises:
   at least 5 cells.

5. The system of claim 3 wherein the electron gun further comprises one of:
   a thermionic cathode, the thermionic cathode being adjacent to a racetrack grid, wherein a cold part of the electron gun is directly exposed to an inside surface of the superconducting cavity; and
   a flange connected to the thermionic cathode with an Al diamond gasket.

6. The system of claim 3 wherein the superconducting cavity further comprises:
   an $Mg_3B_2$ cavity.

7. The system of claim 1 wherein the electron gun further comprises: Tungsten slits configured to control current.

8. The system of claim 7 wherein the manufacturing system comprises an electron beam melting apparatus.

9. The system of claim 8 wherein the electron beam melting apparatus further comprises:
   a beam bending assembly configured to adjust a position of the electron beam in the build chamber the beam bending assembly comprising at least one electromagnet and a computer system configured to control the at least one electromagnet;
   a build platform configured in the build chamber; and
   a powder tank configured to provide powder to the build chamber.

10. The system of claim 1 wherein the conduction cooling system further comprises:
    a refrigeration source;
    a cavity cooler in conductive contact with the particle accelerator; and
    a cooling connector forming a conductive connection between the cavity cooler and the refrigeration source.

11. The system of claim 10 wherein the refrigeration source comprises a cryocooler.

12. A manufacturing system comprising:
    a superconducting radio frequency accelerator configured to produce an electron beam;
    a conduction cooling system configured to cool the superconducting radio frequency accelerator;
    an electron beam melting system wherein the electron beam melts a build material associated with the electron beam melting apparatus; and
    a flange connecting the electron beam melting system to the super conducting radio frequency accelerator.

13. The manufacturing system of claim 12 wherein the superconducting radio frequency accelerator further comprises:
    a superconducting cavity;
    an electron gun;
    a power coupler; and
    a beam dump comprising a Faraday cup.

14. The manufacturing system of claim 13 wherein the superconducting cavity further comprises:
    a niobium cavity with 1.5 cells, operating at 1 MV/m.

15. The manufacturing system of claim 12 wherein the electron beam melting apparatus further comprises:
    a beam bending assembly comprising at least one electromagnet configured to adjust a position of the electron beam in the build chamber;
    a computer system configured to control the at least one electromagnet;
    a build platform configured in a build chamber; and
    a powder tank configured to provide the build material to the build chamber.

16. The manufacturing system of claim 13 wherein the conduction cooling system further comprises:
    a refrigeration source;
    a cavity cooler in conductive contact with the superconducting cavity; and
    a cooling connector forming a conductive connection between the cavity cooler and the refrigeration source.

17. The manufacturing system of claim 16 wherein the refrigeration source comprises a cryocooler.

18. A manufacturing apparatus comprising:
    a superconducting radio frequency accelerator configured to produce an electron beam;
    a refrigeration source comprising a cryocooler;
    a cavity cooler for conducting thermal energy away from the superconducting radio frequency accelerator;
    a cooling connector forming a conductive connection between the cavity cooler and the refrigeration source;
    an electron beam melting assembly comprising:
        a beam bending assembly configured to adjust a position of the electron beam; and
        a build platform configured to hold a build material, wherein the electron beam melts the build material; and
    a flange connecting the electron beam melting system to the super conducting radio frequency accelerator.

19. The additive manufacturing apparatus of claim 18 wherein the superconducting radio frequency accelerator further comprises:
    a superconducting cavity;
    an electron gun comprising a thermionic cathode, the thermionic cathode being adjacent to a racetrack grid, wherein a cold part of the electron gun is directly exposed to an inside surface of the superconducting cavity, and a flange connected to the thermionic cathode with an Al diamond gasket; and
    a power coupler.

20. The additive manufacturing apparatus of claim 18 wherein the superconducting cavity is configured to generate at least a 50 kW beam power at 1 MeV, and a beam current of at least 50 mA in a continuous wave operation.

* * * * *